United States Patent
Harman et al.

(10) Patent No.: US 6,233,159 B1
(45) Date of Patent: *May 15, 2001

(54) BRACKET FOR SUPPORTING AND ALIGNING A CIRCUIT COMPONENT WITH RESPECT TO A CIRCUIT BOARD

(75) Inventors: Dedra Lee Harman, Wabash; David A Gomes, Kokomo; Brian Allen Warren, Sims, all of IN (US)

(73) Assignee: Delco Electronics Corporation, Kokomo, IN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/799,057

(22) Filed: Feb. 10, 1997

(51) Int. Cl.[7] ................ H05K 7/20; H02B 1/01
(52) U.S. Cl. ............ 361/825; 361/704; 361/707; 257/712; 257/713; 174/16.3
(58) Field of Search .................. 165/80.2, 80.3; 24/457, 458; 174/16.3; 257/712, 713, 718, 719, 725, 727; 267/150; 361/704, 707, 767, 769, 709–712, 719, 825, 720; 439/81, 82, 485; 438/117

(56) References Cited

U.S. PATENT DOCUMENTS 5,450,284 * 9/1995 Wekell .................... 361/710

OTHER PUBLICATIONS

Disclosed Annoymously, "Integrated Bracket & Spring Mount," Research Disclosure, Oct. 1993, pp. 642.

* cited by examiner

*Primary Examiner*—Donald Sparks
*Assistant Examiner*—John B. Vigushin
(74) *Attorney, Agent, or Firm*—Jimmy L. Funke

(57) ABSTRACT

A bracket for supporting and aligning a circuit component, such as a voltage regulator, on a circuit board during assembly. The bracket frictionally engages the component to restrain the component's movement and raised dimples position the component so that a hole in the component is aligned with holes in the bracket. Proper alignment of the holes allows proper insertion of a fastener which clamps the bracket and component to a heat-dissipating surface. The design of the bracket overcomes the necessity of machining an allowance in the heat-dissipating surface as is required to accommodate the prior art bracket. The bracket also prevents the application of stresses at the junction between the component and its leads when the leads are inserted through holes in the circuit board.

8 Claims, 1 Drawing Sheet

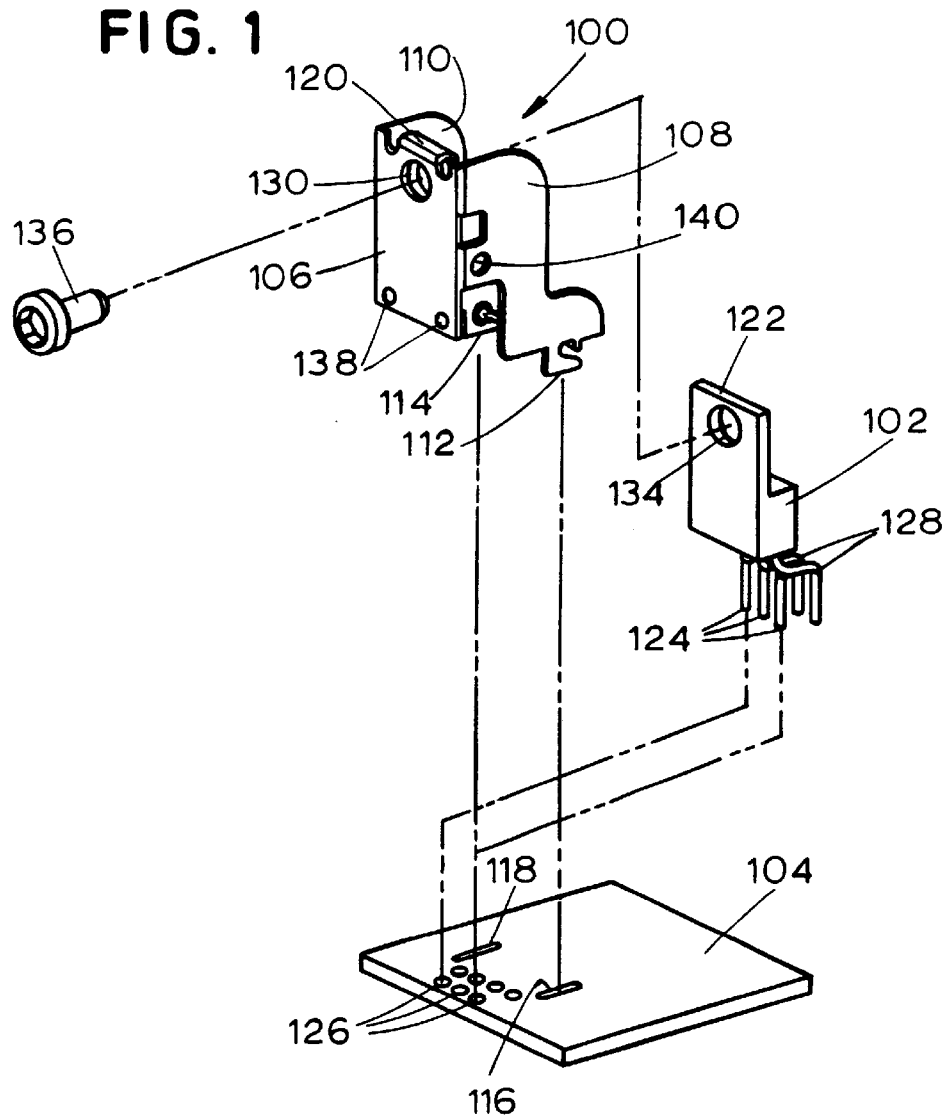
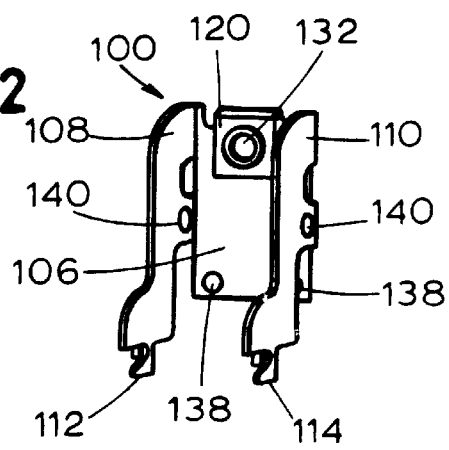

BRACKET FOR SUPPORTING AND ALIGNING A CIRCUIT COMPONENT WITH RESPECT TO A CIRCUIT BOARD

FIELD OF THE INVENTION

This invention relates to an apparatus that supports a circuit component on a circuit board. More particularly, the invention relates to a bracket that supports a circuit component on a circuit board during a wave-solder process and secures the component to a heat-dissipating surface for heat transfer.

BACKGROUND OF THE INVENTION

Brackets are used to support circuit components during the assembly of integrated circuits on circuit boards, and to secure the circuit components to heat-dissipating surfaces used for heat transfer. For example, one type of prior art bracket is used to support a voltage regulator while the voltage regulator is secured to the circuit board during a wave-solder process. The bracket also secures the regulator to a heat-dissipating surface, such as the external casing of the circuit board, when a thread-forming screw is inserted through the heat-dissipating surface, the regulator, and the bracket. The leads of the regulator are inserted into corresponding holes in the circuit board until the knees of some of the leads contact the circuit board. The bracket is placed on the circuit board by inserting the bracket's feet through the corresponding slots in the circuit board. The bracket simultaneously traps the top edge of the regulator by engaging the top edge of the regulator with a hook located on the top edge of the bracket. The hook prevents the regulator from tipping away from the bracket, but the hook does not secure or clamp the regulator to the bracket. A hole in the bracket is engaged by the thread-forming screw, which also engages a corresponding hole in the regulator, to clamp the regulator to the heat-dissipating surface. Tabs on the bracket feet are twisted to stabilize the bracket on the circuit board prior to the wave-solder process.

In the prior art bracket described above, the hook necessitates additional operations to provide clearance in the heat-dissipating surface for the hook, which extends past the regulator and the edge of the circuit board. The manufacturer must either emboss an indentation or punch out a hole in the heat-dissipating surface to avoid interference between the hook and the heat-dissipating surface. Once the allowance for the hook is made in the heat-dissipating surface, the circuit board with the bracket requires special loading to ensure that the hook properly aligns with the indentation or hole. Additionally, the prior art bracket requires positioning the holes relatively close to the edge of the circuit board which requires special machining operations that can increase the cost of the circuit board.

SUMMARY OF THE INVENTION

In one form of the present invention, a bracket for supporting and aligning a circuit component with respect to a circuit board has a substantially flat mounting surface with front and rear faces and top, bottom, left, and right edges. A plurality of legs, sufficient to support the mounting surface of the bracket and the circuit component, extend rearwardly and downwardly from the left and right edges of the mounting surface. Feet, which extend downwardly from each leg, are positioned to align with slots in the circuit board. The feet are inserted into corresponding slots in the circuit board to secure the bracket to the circuit board. A tab extends rearwardly and downwardly from the top edge of the mounting surface such that the top edge of a circuit component can be inserted between the tab and the rear face of the mounting surface. The tab is dimensioned to frictionally engage the top edge of the inserted circuit component.

The mounting surface and the tab of the bracket have coaxial holes. These holes align with a corresponding hole in the circuit component when the top edge of the circuit component is inserted between the tab and the rear face of the mounting surface. Raised dimples on the rear face of the mounting surface engage the bottom edge of the circuit component and align the hole in the circuit component vertically with respect to the holes in the mounting surface and the tab. Additional raised dimples on each bracket leg are adapted to frictionally engage and secure the circuit component to the bracket and to align the hole of the circuit component horizontally with respect to the holes in the mounting surface and the tab. The frictional engagement of the tab, along with the vertical and horizontal positioning of the raised dimples on the rear of the flat mounting surface and the bracket legs, respectively, align the circuit component properly for the wave-solder process and for the insertion of a fastener without the necessity of additional positioning steps.

In summary, it is a general object of this invention to provide an improved bracket for supporting and vertically and horizontally aligning circuit components during the wave-solder process which simplifies the assembly and reduces the cost of manufacturing integrated circuits on circuit boards.

It is yet another object of this invention to provide a bracket with greater clearance from the circuit component leads to further reduce the risk of shorting the circuit.

The invention may best be understood by reference to the following description when considered with the accompanying illustrations.

BRIEF DESCRIPTION OF THE DRAWINGS

FIG. 1 is an exploded isometric view of an assembly composed of a circuit board, a regulator, a thread-forming screw, and a bracket according to the present invention.

FIG. 2 is a rear isometric view of a bracket according to the present invention.

DETAILED DESCRIPTION OF THE DRAWINGS

FIG. 1 illustrates a bracket 100 according to the present invention for supporting a circuit component 102, such as a voltage regulator, on a circuit board 104. The bracket 100 has a substantially flat mounting surface 106 having front and rear faces and top, bottom, left, and right edges. The mounting surface 106 is preferably manufactured from a material with a high thermal conductivity, such as ternplated steel or tin-plated steel. Legs 108, 110 extend rearwardly and downwardly from the left and right edges, respectively, of the mounting surface 106. Feet 112, 114 extend downwardly from the end of the legs 108, 110, with the feet 112, 114 positioned to align with and engage corresponding slots 116, 118 in the circuit board 104. A tab 120 extends rearwardly and downwardly from the top edge of the mounting surface 106. The tab 120 is dimensioned such that the circuit component 102 is frictionally engaged by the tab 120 when a top edge 122 of the component 102 is inserted between the tab 120 and the rear face of the mounting surface 106. FIG. 2 is a rear view of the bracket 100 according to the present invention which more fully illustrates the tab 120 and its features.

FIG. 1 illustrates the assembly of the bracket 100 and component 102, and subsequent attachment to the circuit board 104. During assembly, the top edge 122 of the component 102 is inserted between the tab 120 and the rear face of the mounting surface 106. The tab 120 frictionally engages the component 102 to prevent slippage of the component 102 during the remainder of the assembly process. The combined bracket 100 and component 102 are inserted into the circuit board 104. The feet 112, 114 on the legs 108, 110 the of bracket 100 are inserted into the slots 116, 118, respectively, in the circuit board 104. A plurality of leads 124 extend downwardly from the component 102 through corresponding holes 126 in the circuit board 104. Some of the plurality of leads 124 have alternating ninety-degree bends which form knees 128 in the bent leads 124. All of the plurality of leads 124, including the leads with knees 128, extend downwardly through the holes 126 in the circuit board 104 when the feet 112, 114 of the regulator bracket 100 are inserted into the slots 116, 118, respectively, in the circuit board 104. The feet 112, 114 of the bracket 100 are then twisted to secure the bracket 100 and the component 102 to the circuit board 104 prior to the wave-solder process. The legs 108, 110 of the bracket 100 are dimensioned such that the knees 128 on the leads 124 do not contact the circuit board 104 when the feet 112, 114 of the bracket 100 are inserted into the slots 116, 118 on the circuit board 104. This feature of the present invention prevents the application of stresses on the leads 124 with knees 128 at the junction of the leads 124 with the body of the component 102.

In a preferred embodiment of the present invention, the mounting surface 106 and the tab 120 of the bracket 100 have coaxial holes 130, 132, respectively. The holes 130, 132 correspond to a hole 134 in the component 102 that engages a fastener 136, such as a thread-forming screw, which clamps the component 102 to a heat-dissipating surface (not shown). The rear face of the mounting surface 106 has a plurality of raised dimples 138 which engage a bottom edge of the component 102 when the component 102 is inserted between the tab 120 and the mounting surface 106. The dimples 138 are positioned on the mounting surface 106 to vertically align the hole 134 of the component 102 with the coaxial holes 130, 132 in the mounting surface 106 and the tab 120, respectively, when the dimples 138 properly engage the bottom edge of the component 102. Raised dimples 140 on the legs 108, 110 of the bracket 100 frictionally engage the sides of the component 102 when the component 102 is inserted between the flat mounting surface 106 and the tab 120. The dimples 140 secure the component 102 in the bracket 100, and horizontally align the hole 134 of the component 102 with the holes 130, 132 in the mounting surface 106 and tab 120, respectively. The dimples 138, 140, and the clamping force applied by the tab 120, secure the component 102 to the bracket 100 during the wave-solder process so that additional measures, such as inserting a dowel through the holes 130, 132, and 134, are not required to properly align the component 102.

The addition of the dimples 140 on the legs 108, 110 increases the clearance between the leads 124 and the legs 108, 110 of the bracket 100. In one embodiment of the present invention used with voltage regulators, each dimple 140 is raised 0.70 millimeters from the face of the corresponding leg 108 or 110. The distance between the legs 108, 110 on the bracket 100 is increased to 11.56 millimeters, with a tolerance of 0.13 millimeters, compared to 10.50 millimeters between the legs on the prior art bracket. This results in a minimum clearance of 0.89 millimeters between the legs 108, 110 of the bracket 100 and the voltage regulator leads. The additional clearance further reduces the risk of the solder on a component lead 124 contacting the legs 108, 110 of the bracket 100 and short circuiting the component 102.

The bracket 100, according to the present invention, has several advantages. The bracket 100 provides proper positioning of the component 102 without interfering with the heat-dissipating surface during assembly. The flat mounting surface 106 eliminates the need for machining a clearance in the heat-dissipating surface as was required to allow for the hook of the prior art bracket. This feature also facilitates positioning the holes 126 for the leads 124 farther from the edge of the circuit board 104, thereby eliminating the need for special operations by the circuit board supplier. Additionally, a bracket 100 fabricated from a material with high thermal conductivity will not impede the flow of heat from the component 102 to the heat-dissipating surface. The component 102 is secured by the tab 120 and the dimples 138, 140 on the bracket 100 in a position which prevents the knees 128 of the leads 124 from contacting the surface of the circuit board 104, thereby reducing the strain at the junction between the leads 124 and the bottom of the component 102. Finally, the dimples 138, 140 align the component 102 to reliably accept the fastener 136 without repositioning the component 102.

Various modifications, alternative constructions and equivalents may be employed without departing from the scope of the invention as exemplified in the foregoing description and further defined in the following claims.

What is claimed is:

1. A bracket for supporting and aligning a circuit component with respect to a circuit board, the bracket comprising:
    a substantially flat mounting surface having front and rear faces and top, bottom, left, and right edges;
    left and right legs extending rearwardly and downwardly from the left and right edges of the mounting surface,
    each leg including a foot extending downwardly and positioned to align with and engage a corresponding slot in the circuit board;
    a tab extending rearwardly and downwardly from the top edge of the mounting surface for frictionally engaging the component against the rear face of the mounting surface when the component is positioned between the tab and the rear face of the mounting surface;
    a raised portion on the rear face of the mounting surface for engaging a bottom edge of the component when the component is in proper vertical alignment on the bracket; and
    raised portions formed on each of the left and right legs for engaging left and right edges of the component when the component is in proper horizontal alignment on the bracket.

2. The bracket according to claim 1 wherein the feet of the bracket and all of a plurality of leads extending downwardly from the component align with holes and slots, respectively, in the circuit board when the tab engages the component.

3. A bracket according to claim 2 wherein the legs on the bracket extend downwardly below knees on at least one component lead when the tab engages the component such that the leads extend through the holes on the circuit board when the bracket feet engage the slots in the circuit board and the knees on the at least one leads do not touch the circuit board.

4. A bracket according to claim 2 wherein the legs and feet of the bracket are dimensioned to allow sufficient clearance from the component leads to avoid short circuiting the component.

5. A bracket according to claim 1 wherein the mounting surface has a first hole therein proximate to the top edge of the mounting surface, the tab has a second hole therein coaxial with the first hole, and the component has a third hole therein which is coaxially aligned with the first and second holes when said component is in proper vertical and horizontal alignment on said bracket such that a fastening means can extend through the first, second and third holes to affix the bracket and component to a heat-dissipating surface.

6. A bracket according to claim 1 wherein the bracket is fabricated from material with high thermal conductivity.

7. A bracket for supporting and aligning a circuit component having a hole formed therein with respect to a circuit board, the bracket comprising:
   a substantially flat mounting surface having front and rear faces and top, bottom, left, and right edges, and a first hole proximate to said top edge;
   a plurality of legs, each leg extending rearwardly and downwardly from the left and right edges of the mounting surface;
   a plurality of feet, each foot extending downwardly from each leg and positioned to align with and engage a corresponding slot in the circuit board;
   a tab extending rearwardly and downwardly from the top edge of the mounting surface and having a second hole therein coaxial with said first hole, said tab being dimensioned such that the circuit component is frictionally engaged by the tab when a top edge of the component is inserted between the tab and the rear face of the mounting surface;
   raised portions on the rear face of the mounting surface, the raised portions adapted to engage a bottom edge of the component and to align the hole of the component vertically with respect to the first and second holes of the bracket such that a fastening means can extend through the first, second and third holes to affix the bracket and component to a heat-dissipating surface, and such that leads extending downwardly from the component align with holes in the circuit board.

8. A bracket for supporting a circuit component on a circuit board, the bracket comprising:
   a substantially flat mounting surface having front and rear faces, top, bottom, left, and right edges, a first hole therein proximate to the top edge of the flat mounting surface, and first raised portions on the rear face of the mounting surface adapted to engage a bottom edge of the component;
   a tab extending rearwardly and downwardly from the top edge of the mounting surface dimensioned such that the circuit component is frictionally engaged by the tab when a top edge of the component is inserted between the tab and the rear face of the mounting surface, the tab having a second hole therein coaxial with the first hole and the component having a third hole therein aligning vertically with the first and second holes when the bottom edge of the component fully engages the first raised portions such that a fastening means can extend through the first, second, and third holes to affix the bracket and component to a heat-dissipating surface;
   a plurality of legs, each leg extending rearwardly and downwardly from the left and right edges of the mounting surface, each of the plurality of legs having second raised portions adapted to frictionally engage and secure the component to the bracket and to align the third hole horizontally with respect to the first and second holes of the bracket such that the fastening means can extend through the first, second, and third holes; and
   a plurality of feet, each foot extending downwardly from each leg and positioned to align with and engage a corresponding slot in the circuit board such that all of a plurality of leads extending downwardly from the component align with corresponding holes in the circuit board and knees on at least one component lead do not touch the circuit board, wherein the legs and feet of the bracket are dimensioned to allow sufficient clearance from the component leads to avoid short circuiting the component.

* * * * *